US010833531B2

(12) United States Patent
Andle et al.

(10) Patent No.: US 10,833,531 B2
(45) Date of Patent: Nov. 10, 2020

(54) ELECTRIC POWER GENERATION OR DISTRIBUTION ASSET MONITORING

(71) Applicant: Rosemount Inc., Shakopee, MN (US)

(72) Inventors: Jeffrey C. Andle, Rockledge, FL (US); David J. Lane, Beverly, MA (US); Thomas M. Cunneen, Beverly, MA (US); Daniel S. Stevens, Stratham, NH (US)

(73) Assignee: ROSEMOUNT INC., Shakopee, MN (US)

( * ) Notice: Subject to any disclaimer, the term of this patent is extended or adjusted under 35 U.S.C. 154(b) by 0 days.

(21) Appl. No.: 16/578,743

(22) Filed: Sep. 23, 2019

(65) Prior Publication Data

US 2020/0106296 A1   Apr. 2, 2020

Related U.S. Application Data

(60) Provisional application No. 62/740,071, filed on Oct. 2, 2018.

(51) Int. Cl.
*H02J 13/00* (2006.01)
*H02J 4/00* (2006.01)
(Continued)

(52) U.S. Cl.
CPC .......... *H02J 13/00* (2013.01); *G06K 7/10445* (2013.01); *H01L 41/1132* (2013.01); *H02J 4/00* (2013.01)

(58) Field of Classification Search
CPC combination set(s) only.
See application file for complete search history.

(56) References Cited

U.S. PATENT DOCUMENTS 3,938,034 A   2/1976   Japenga
4,904,996 A   2/1990   Fernandes
(Continued)

FOREIGN PATENT DOCUMENTS

CA   2 192 856   9/2000
CA   2 455 206   5/2012
(Continued)

OTHER PUBLICATIONS

"Partial Discharge Theory and Applicants to Electrical Systems", by G. Paoletti et al., IEEE IAS Pulp and Paper Industry Conference in Seattle, WA, 1999.
(Continued)

*Primary Examiner* — Travis R Hunnings
(74) *Attorney, Agent, or Firm* — Westman, Champlin & Koehler, P.A.

(57) ABSTRACT

A sensor module for monitoring an asset in an electrical power generation or distribution system includes a module body, a sensor, a sensor near field coupling structure, and an interrogation near field coupling structure. The sensor is supported by the module body, arranged to sense a parameter of the asset and configured to generate a sensor output relating to the parameter. The sensor near field coupling structure is connected to the sensor and supported on a first side of a module body. The interrogation near field coupling structure is supported on a second side of the module body. The sensor output is transmitted from the sensor near field coupling structure to the interrogation near field coupling structure. The sensor module is configured to provide electrical isolation between the asset and a monitoring circuit configured to receive the sensor output through the interrogation near field coupling structure.

24 Claims, 7 Drawing Sheets

(51) Int. Cl.
*G06K 7/10* (2006.01)
*H01L 41/113* (2006.01)

(56) References Cited

U.S. PATENT DOCUMENTS

| | | | |
|---|---|---|---|
| 4,937,763 | A | 6/1990 | Mott |
| 5,063,931 | A | 11/1991 | Leavitt |
| 5,612,930 | A | 3/1997 | Hazony et al. |
| 5,815,352 | A | 9/1998 | Mackenzie |
| 5,933,012 | A | 8/1999 | Bengtsson et al. |
| 6,002,260 | A | 12/1999 | Lau et al. |
| 6,172,862 | B1 | 1/2001 | Jonnatti et al. |
| 6,297,642 | B1 | 10/2001 | Shibahara et al. |
| 6,424,162 | B1 | 7/2002 | Rokunohe et al. |
| 6,483,316 | B2 | 11/2002 | Kato et al. |
| 6,774,639 | B1 | 8/2004 | Unsworth |
| 7,071,701 | B2 | 7/2006 | Roman et al. |
| 7,577,535 | B2 | 8/2009 | Anderson et al. |
| 7,676,333 | B2 | 3/2010 | Younsi et al. |
| 7,912,660 | B2 | 3/2011 | Anderson et al. |
| 8,271,213 | B2 | 9/2012 | Xu et al. |
| 8,466,690 | B2 | 6/2013 | Stewart et al. |
| 9,372,221 | B1 | 6/2016 | Bierman |
| 9,733,285 | B2 | 8/2017 | Kennedy et al. |
| 9,753,080 | B2 | 9/2017 | Andle et al. |
| 2003/0093390 | A1 | 5/2003 | Onoda et al. |
| 2005/0035768 | A1 | 2/2005 | Rabach et al. |
| 2005/0194979 | A1 | 9/2005 | Roman et al. |
| 2007/0059986 | A1* | 3/2007 | Rockwell ........... G01R 19/2513 439/638 |
| 2007/0272827 | A1 | 11/2007 | Heo et al. |
| 2008/0133154 | A1 | 6/2008 | Krauss |
| 2008/0204950 | A1 | 8/2008 | Zhou et al. |
| 2008/0309351 | A1 | 12/2008 | Steward et al. |
| 2009/0251308 | A1 | 10/2009 | Schweitzer, III et al. |
| 2010/0072355 | A1 | 3/2010 | Schweitzer, III et al. |
| 2010/0114392 | A1 | 5/2010 | Lancaster |
| 2010/0271152 | A1 | 10/2010 | Sabah et al. |
| 2011/0234215 | A1 | 9/2011 | Ausserlechner |
| 2011/0234362 | A1 | 9/2011 | Koehler et al. |
| 2011/0249370 | A1 | 10/2011 | Nayak et al. |
| 2012/0134058 | A1 | 5/2012 | Pamer et al. |
| 2012/0185185 | A1 | 7/2012 | Bae et al. |
| 2013/0192376 | A1 | 8/2013 | Zhou et al. |
| 2013/0234726 | A1 | 9/2013 | Hobelsberger |
| 2014/0270205 | A1 | 9/2014 | Miller |
| 2015/0043310 | A1 | 2/2015 | Maas et al. |
| 2015/0160098 | A1 | 6/2015 | Noda et al. |
| 2015/0253362 | A1* | 9/2015 | Louzir ............... G06K 7/10297 324/126 |
| 2015/0260778 | A1 | 9/2015 | Park et al. |
| 2015/0317229 | A1 | 11/2015 | Wada et al. |
| 2016/0209454 | A1 | 7/2016 | McCammon et al. |
| 2016/0209459 | A1 | 7/2016 | Tozzi et al. |
| 2016/0231375 | A1 | 8/2016 | Roemer et al. |
| 2017/0038424 | A1 | 2/2017 | Ikegami et al. |
| 2017/0193252 | A1* | 7/2017 | Ehrhardt ............... H04B 5/0031 |
| 2018/0062003 | A1 | 3/2018 | Luan et al. |
| 2018/0252760 | A1 | 9/2018 | Andle et al. |
| 2018/0356357 | A1 | 12/2018 | Samarao |
| 2019/0250198 | A1 | 8/2019 | Kubena et al. |

FOREIGN PATENT DOCUMENTS

| | | |
|---|---|---|
| CA | 2 821 795 | 7/2012 |
| CN | 203025311 | 6/2012 |
| DE | 26 41 047 | 3/1978 |
| DE | 10 2015 113804 | 2/2017 |
| EP | 0 061 254 | 10/1985 |
| EP | 1 566 646 | 8/2005 |
| EP | 1 222 472 | 8/2006 |
| EP | 2 063 276 | 5/2009 |
| EP | 2 437 075 | 4/2012 |
| EP | 2 324 364 | 5/2012 |
| EP | 2 608 338 | 6/2013 |
| EP | 2 763 259 | 6/2014 |
| EP | 3 121 610 | 1/2017 |
| EP | 3 141 911 | 3/2017 |
| FR | 1 181 357 | 6/1959 |
| GB | 2 321 713 | 5/1998 |
| JP | 2002-131366 | 5/2002 |
| JP | 2004-61358 | 2/2004 |
| JP | 2011-095036 | 5/2011 |
| KR | 10-2013-0060442 | 6/2013 |
| KR | 10-1280763 | 7/2013 |
| KR | 10-1285146 | 7/2013 |
| RU | 2 483 315 | 5/2013 |
| TW | 201 340 135 | 10/2013 |
| WO | WO 2007/070942 | 6/2007 |
| WO | WO 2013/038210 | 3/2013 |
| WO | WO 2013/124886 | 8/2013 |
| WO | WO 2013/131948 | 9/2013 |
| WO | WO 2013/136793 | 9/2013 |
| WO | WO 2013/139131 | 9/2013 |
| WO | WO 2014/053187 | 4/2014 |
| WO | WO 2017/053187 | 4/2014 |
| WO | WO 2014/189975 | 11/2014 |
| WO | WO 2017/029415 | 2/2017 |

OTHER PUBLICATIONS

"Continuous Partial Discharge Monitoring with Assessed Condition Trending System (ACTS)", by C. Wendel et al., Cigre-Mexico, 2001.
"Ubiquitous UHF Monitoring System for Partial Discharge Detection and Trending", by J. Andle et al., IEEE, 2015.
Oil, Gas, and Petrochemicals Users Group Meeting, 2012, 2 pgs.
Notification of Transmittal of the International Search Report and the Written Opinion of the International Searching Authority from PCT/US2018/020585, dated Jun. 25, 2018.
"Ubiquitous, On-Line, Partial Discharge Trending", by J. Andle et al., Electrical Insulation Conference (EIC) San Antonio, TX, Jun. 2018, IEEE, 6 pgs.
"Using Continuous Temperature Monitoring to Avoid Critical Asset Failure" by J. Andle et al., Electric Light & Power, Jul. 2015, 7 pgs.
"Partial Discharge Testing: A Progress Report" by V. Warren, PD Progress Report, IRMC 2013, 11 pgs.
"Ameren Illinois Smart Grid Test Bed Evaluation", by B. Snyder et al., Quanta Technology, LLC, 2017, 30 pgs.
"Analytics Use Cases and Foundational Components", IEEE BDA Webinar Series: Big Data & Analytics for Power Systems, Dec. 8, 2017, 12 pgs.
Invitation to Pay Additional Fees from PCT/US2018/057461, dated Jan. 23, 2019.
"Preventing Transmission Line Damage Caused by Ice with Smart On-Line Conductor Monitoring", by N. Gubeljak et al., IEEE, 2016, 10 pgs.
"Dynamic Thermal Ratings Realize Circuit Load Limits", by D. Douglass et al., IEEE Computer Applications in Power, 2000, 8 pgs.
"Real-Time Monitoring and Dynamic Thermal Rating of Power Transmission Circuits", by D. Douglass et al., IEEE Transactions on Power Delivery, vol. 11, No. 3, Jul. 1996, 12 pgs.
"Network Planning Evaluation Implementing Time Varying Thermal Ratings", by A. Kapetanaki et al., IEEE, 2014, 6 pgs.
"Electrothermal Coordinating in Cable Based Transmission Grids", by R. Olsen et al., IEEE Transactions on Power Systems, vol. 28, No. 4, Nov. 2013, 8 pgs.
Notification of Transmittal of the International Search Report and the Written Opinion of the International Searching Authority from PCT/US2015/064385, dated Mar. 30, 2016.
"Advanced Measuring System for the Analysis of Dielectric Parameters including PD Events", by Lemke et al, Electrical Insulation Conference and Electrical Manufacturing & Coil Winding Conference, Oct. 1999.
Office Action from U.S. Appl. No. 14/961,321 dated Jan. 10, 2017.
Notification of Transmittal of the International Search Report and the Written Opinion of the International Searching Authority from PCT/US2018/057461, dated Apr. 18, 2019.

(56) References Cited

OTHER PUBLICATIONS

Notification of Transmittal of the International Search Report and the Written Opinion of the International Searching Authority from PCT/US2019/018392, dated Jun. 3, 2019.
Notification of Transmittal of the International Search Report and the Written Opinion of the International Searching Authority from International Application No. PCT/US2019/027669, dated Jul. 23, 2019.
Communication from European Patent Application No. 18712051.4, dated Sep. 18, 2019.
Office Action from Chinese Patent Application No. 201920428356.3, dated Nov. 7, 2019.
Notification of Transmittal of the International Search Report and the Written Opinion of the International Searching Authority from International Application No. PCT/US2019/053726, dated Dec. 17, 2019.
Office Action from U.S. Appl. No. 16/227,478, dated Feb. 5, 2020.

\* cited by examiner

ELECTRIC POWER GENERATION OR DISTRIBUTION ASSET MONITORING

CROSS-REFERENCE OF RELATED APPLICATION

The present application is based on and claims the benefit of U.S. provisional patent application Ser. No. 62/740,071, filed Oct. 2, 2018, the content of which is hereby incorporated by reference in its entirety.

BACKGROUND

There is a growing need to directly instrument power generation and delivery equipment under intelligent, predictive asset management and maintenance programs. This has resulted in a variety of prior art sensors that mount directly onto the relatively large copper connections in high value power assets. In the typical application of these prior art sensors, it was possible to individually mount sensors to conductors while meeting the space requirements for safe operation of the high voltage equipment.

There is a more recent trend in the electric power industry to extend asset management to lower voltage assets. Previously, these assets were deemed too inexpensive to justify monitoring; however, more recently it is understood that the monitoring system is protecting a process, not the asset. If the low-cost asset fails and power is interrupted to a critical system, the cost of failure can run into millions or even billions of dollars of lost revenue.

One problem that arises is that low cost assets, such as copper buswork, typically have a high density of conductors in a small space (e.g., in a cabinet). The high density of conductors can make traditional wireless methods based on radiative coupling difficult to implement and the large number of measurement points in close proximity result in an increasing degree of interference between same-frequency or same-code sensors in such traditional wireless systems.

SUMMARY

Embodiments of the present disclosure are directed to a sensor module for monitoring an asset in an electrical power generation or distribution system. In some embodiments, the sensor module includes a module body, a sensor, a sensor near field coupling structure, and an interrogation near field coupling structure. The sensor is supported by the module body, arranged to sense a parameter of the asset and configured to generate a sensor output relating to the parameter. The sensor near field coupling structure is connected to the sensor and supported on a first side of a module body. The interrogation near field coupling structure is supported on a second side of the module body. The sensor output is transmitted from the sensor near field coupling structure to the interrogation near field coupling structure. The sensor module is configured to provide electrical isolation between the asset and a monitoring circuit configured to receive the sensor output through the interrogation near field coupling structure.

Other embodiments of the sensor module for monitoring one or more assets in an electrical power generation or distribution system include a module body, a plurality of sensors, a plurality of near field coupling structures, and a plurality of interrogation near field coupling structures. Each sensor is supported by the module body, arranged to sense a parameter of the one or more assets and configured to generate a sensor output relating to the parameter. Each sensor near field coupling structure is supported on a first side of a module body and is configured to transmit the sensor output from one of the sensors. The plurality of interrogation near field coupling structures are supported on a second side of the module body. Each interrogation near field coupling structure is configured to receive the sensor output from one of the plurality of sensor near field coupling structures. The sensor module is configured to provide electrical isolation between the one or more assets and a monitoring circuit configured to receive the sensor outputs through the interrogation near field coupling structures.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the Background.

DETAILED DESCRIPTION OF ILLUSTRATIVE EMBODIMENTS

Wireless sensor systems for monitoring assets of electrical power generation or distribution systems typically rely on antennas for data communication including an interrogation antenna and the sensor having a sensor antenna. In the far field and the transition field, antenna signal transfer efficiency is inversely proportional to the distance squared and practical systems operate with antenna spacings of 10 cm to a few meters at UHF frequencies. The lower spacing limit is determined by the specific frequency and wavelength, and the upper spacing limit is governed by the allowed transmitter power and receiver noise figure. Generally, only one sensor of each frequency should be within the allowed distance of an interrogation antenna to prevent mutual interference. The large spacing requirements of such antenna based asset monitoring systems, prevent their use in monitoring densely populated assets.

Figure 1:
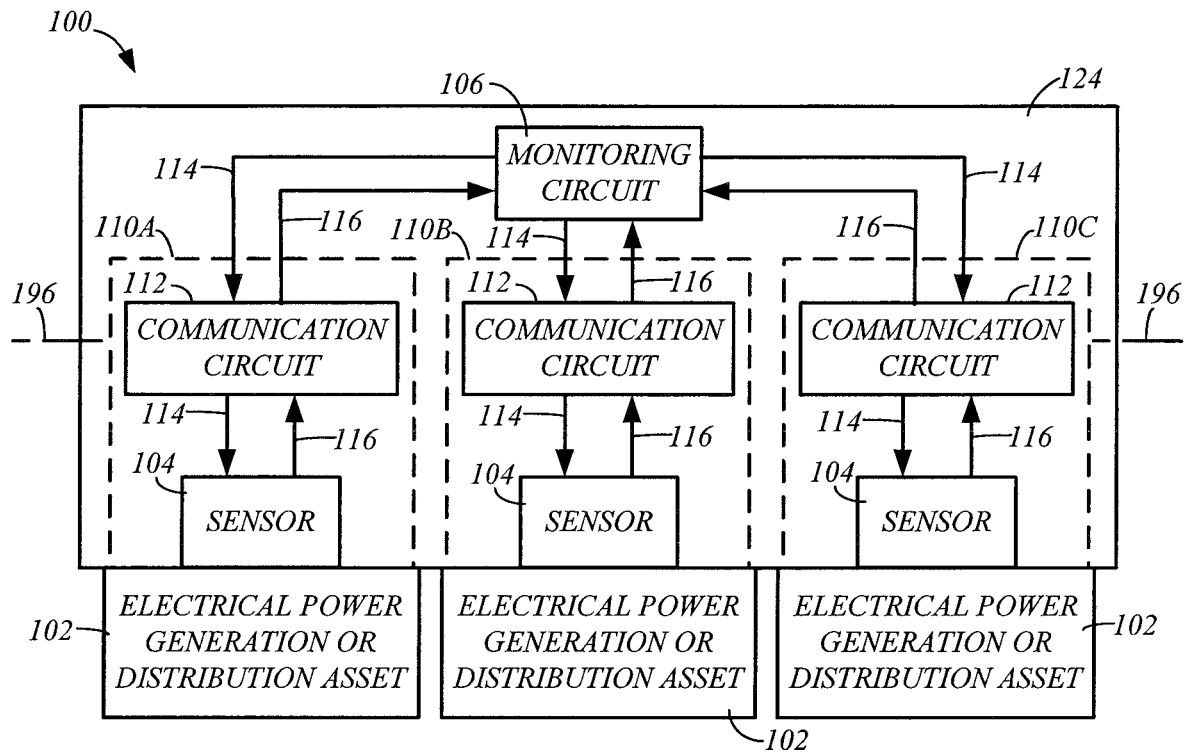
FIG. 1 is a simplified diagram of an exemplary system for monitoring one or more assets of an electrical generation or distribution system, in accordance with embodiments of the present disclosure.

Embodiments of the present disclosure are directed to systems for monitoring assets, such as assets of power generation or distribution systems, that significantly reduce the spacing requirements between sensors, and allow the systems to monitor densely populated groups of assets. FIG. 1 is a simplified diagram of an exemplary system 100 for monitoring one or more assets 102 of an electrical generation or distribution system using corresponding sensors 104 and one or more monitoring circuits 106, in accordance with embodiments of the present disclosure. The system 100 and the assets 102 may be contained in a housing, such as a cabinet or other structure.

The system 100 may comprise one or more sensing modules 110, such as sensor modules 110A-C shown in FIG. 1. Each of the modules 110 includes a sensor 104, which corresponds to one of the assets, and a communication circuit 112 for communicating the signals between the sensors 104 and the monitoring circuit 106. Each module 110 may include a monitoring circuit 106, or multiple modules 110 may utilize the same monitoring circuit 106, as indicated in FIG. 1.

The sensors 104 are each configured to sense a parameter of the corresponding asset, such as a temperature of the asset 102, humidity of the asset, or other parameter, and may take on any suitable form. In some embodiments, the sensors 104 are passive sensors that are powered by the control signals 114 received from the monitoring circuit 106 through the communication circuit 112, and generate a sensor output or signals 116 in response to the signal 114 that is indicative of the sensed parameter of the asset 102. Exemplary sensors 104 include piezoelectric acoustic wave sensors, such as passive surface acoustical wave (SAW) sensors, bulk acoustic wave sensors, or tuning fork acoustic wave sensors, as well as alternate sensors such as radio frequency identification (RFID) sensors, or other suitable sensors. The invention is best practiced with sensors that may be controlled by and measured by radio frequency signals from tens of kilohertz (e.g. tuning forks) to a few gigahertz (e.g. SAW resonator or delay line sensors) and RFID chips.

The control signals 114 may take on any suitable faun. In some embodiments, when the sensor 104 is a piezoelectric acoustic wave sensor, the control signals 114 comprise a series of radio frequency (RF) pulses and the sensor output 116 comprises a series of RF echoes. In some embodiments, when the sensor 104 is an RFID sensor, the control signals 114 comprise an RFID interrogation signal and the sensor output 116 comprises a backscattered RFID response.

The one or more monitoring circuits 106 may each include one or more processors, control circuits, microprocessor-based engine control systems, one or more programmable hardware components, such as a field programmable gate array (FPGA), and/or memory containing computer readable instructions, the execution (e.g., by the one or more processors) of which, cause the system 100 to perform one or more functions described herein. Any suitable patent subject matter eligible computer readable media or memory may be utilized including, for example, hard disks, CD-ROMs, optical storage devices, or magnetic storage devices. Such computer readable media or memory do not include transitory waves or signals.

The monitoring circuit 106 is configured to communicate the signals 114 to the sensors 104 and process the signals 116 received from the sensors 104, which are indicative of the sensed parameter of the asset. The monitoring circuit 106 may also process the signals 116, communicate the parameter values sensed by the sensors 104 to a central control unit or other computing device, and/or perform another action.

In some embodiments, the monitoring circuit 106 may be used to detect degradation or failure of the asset 102. For example, the assets 102 shown in the exemplary system of FIG. 1 may represent energized conductors, such as cable clamps for a three-phase power breaker. Over time, the mechanical connections between the cable clamps and the high voltage conductors may degrade (e.g., loosen), resulting in higher circuit impedance. This can lead to higher temperatures, which can present a fire hazard. The temperatures of the cable clamps may be detected using the sensors 104 by, for example, placing the sensors 104 in contact with the cable clamps. The condition of the cable clamps may then be monitored based on their sensed temperatures using the monitoring circuit 106. When the detected temperature of one of the cable clamps exceeds a threshold temperature, which indicates a level of degradation of the cable clamp, the monitoring circuit 106 may, for example, send a notification to an administrator, issue an alarm, or perform another action to indicate that the cable clamp needs to be examined for repair or replacement. The monitoring circuit 106 may also record and analyze trends in the detected parameter to detect longer term degradation of the asset 102.

Figure 2:
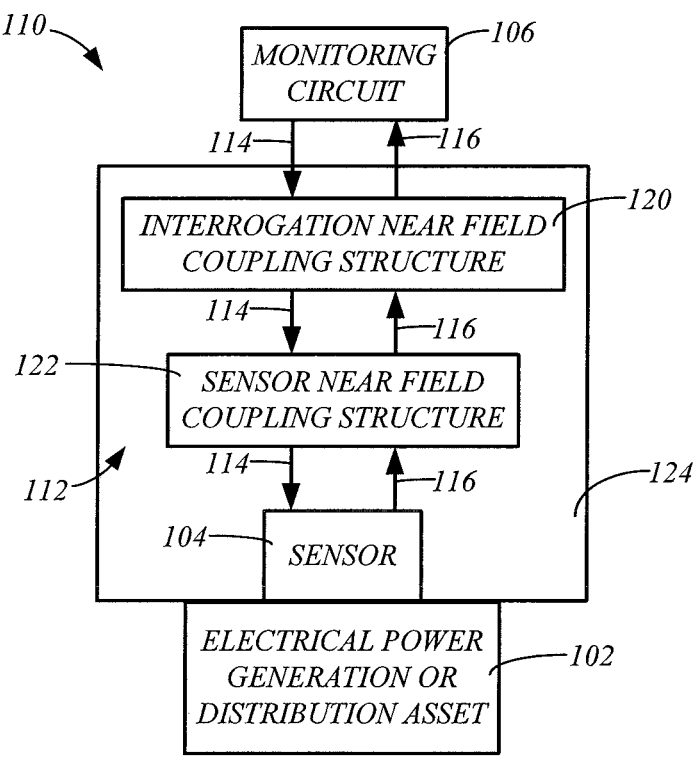
FIG. 2 is a simplified diagram of an exemplary sensor module, in accordance with embodiments of the present disclosure.

FIG. 2 is a simplified diagram of an exemplary sensor module 110 of the system 100 having a communication circuit 112 that is configured to communicate the signals 114 and 116 between the monitoring circuit 106 and the sensor 104 through a near field coupling, in accordance with embodiments of the present disclosure. In one embodiment, the communication circuit 112 includes an interrogation near field coupling structure 120 and a sensor near field coupling structure 122, which operate to communicate the signals 114 and 116 through suitable near field coupling, such as a capacitive or magnetic coupling, for example. Thus, the interrogation near field coupling structure 120 receives interrogation signals 114 generated by the monitoring circuit 106, and communicates the signals 114 to the sensor near field coupling structure 122 through a suitable near field coupling (e.g., capacitive or magnetic), and the signals 114 are delivered to the sensor 104 from the sensor near field coupling structure 122. The sensor 104 may use the signal 114 to generate a response signal 116 that indicates a value of the sensed parameter (e.g., temperature). The response signal 116 is delivered to the sensor near field coupling structure 122, which communicates the signal 116 to the interrogation near field coupling structure 120 through the near field coupling, and the monitoring circuit 106 receives the signal 116 from the interrogation near field coupling structure 120.

The near field coupling between the interrogation near field coupling structure 120 and the sensor near field coupling structure 122 has an efficiency that is inversely proportional to the distance between the structures 120 and 122 cubed. As a result, the modules 110 may be placed in much closer proximity (e.g., 20-100 mm) to each other relative to that allowed in conventional antenna-based sensor systems (e.g., 10 cm), without interference. This allows the system 100 to utilize a relatively dense population of the modules 110 and sensors 104 to monitor densely populated assets 102. For example, at 433 MHz the near field coupling is considered to extend ~86 mm (λ/8) and reliable capacitive coupling of sensors (e.g., SAW sensors) has been demonstrated for up to 50 mm.

In some embodiments, each sensor module 110 includes a module body 124, to which the communication circuit 112 and sensor 104 are attached, as indicated in FIGS. 1 and 2. The module body 124 may also support the monitoring circuit 106, as indicated in FIG. 1. In some embodiments, a single module body 124 may support multiple communication circuits and sensors, as shown in FIG. 1. Alternatively, each sensor module 110 may include its own module body 124, as indicated in FIG. 2.

Figure 3:
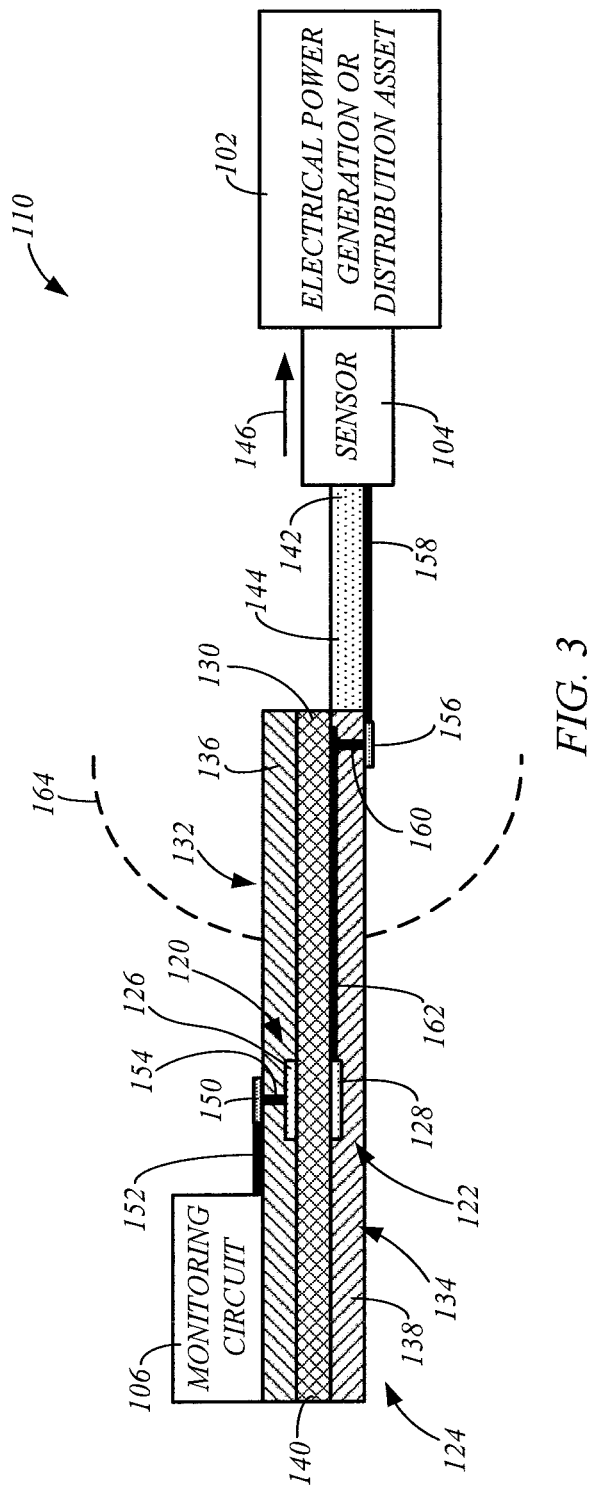
FIG. 3 is a simplified side cross-sectional view of an exemplary sensor module, in accordance with embodiments of the present disclosure.
Figure 4:
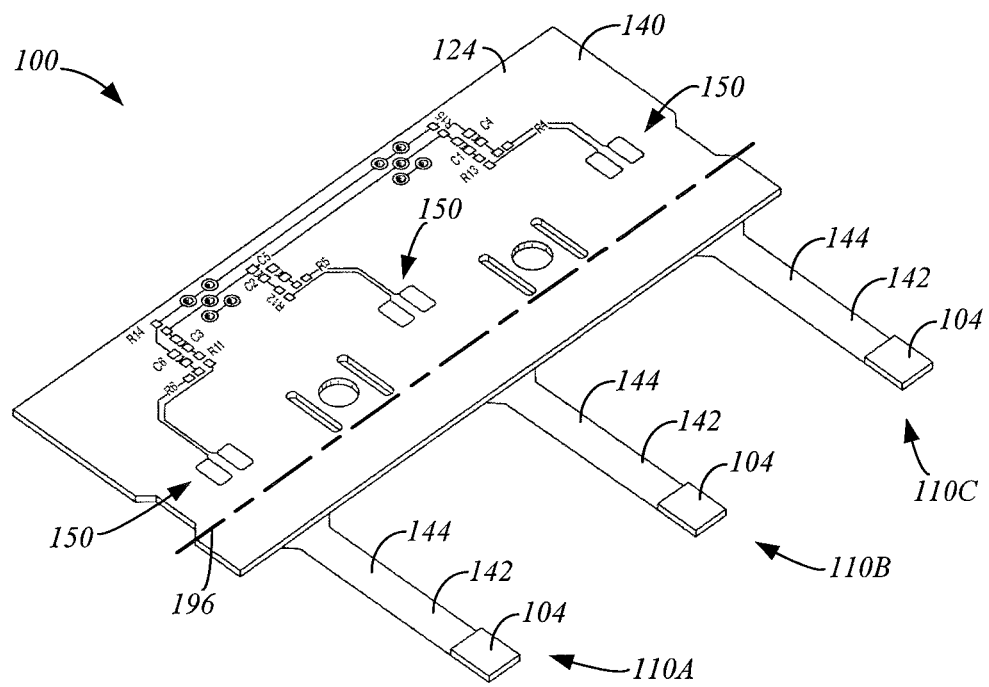
FIGS. 4 and 5 are top isometric and bottom plan views of an exemplary system, in accordance with embodiments of the present disclosure.
Figure 5:
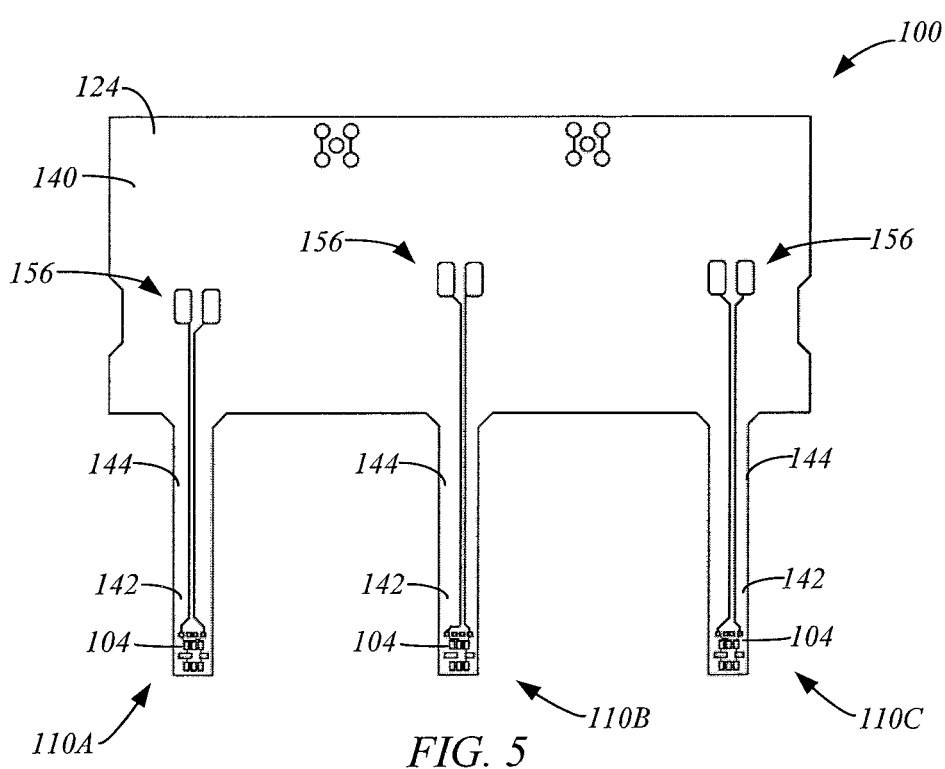

FIG. 3 is a simplified side cross-sectional view of an exemplary sensor module 110, and FIGS. 4 and 5 are top isometric and bottom plan views of an exemplary system 100 comprising three sensor modules 110, in accordance with embodiments of the present disclosure. In FIG. 3, the interrogation near field coupling structure 120 and the sensor near field coupling structure 122 are each illustrated as capacitive coupling structures having electrode plates or pads 126 and 128, respectively. Alternatively, the interrogation near field coupling structure 120 and the sensor near field coupling structure 122 may take the form of magnetic coupling structures, such as coils, as discussed below in greater detail.

In some embodiments, the module body 124 comprises a layer 130, and the interrogation near field coupling structure 120 (pads 126) is positioned on a side 132 of the layer, and the sensor near field coupling structure 122 (pads 128) is positioned on a side 134 of the layer 130 that is opposite the side 132. In some embodiments, the module body 124 includes layers 136 and 138 that sandwich the layer 130, as shown in FIG. 3. In some embodiments, the layers 130, 136 and/or 138 of the module body 124 may each be formed of a dielectric material, such as a printed circuit board, for example.

The module body 124 may also include a main body portion 140 supporting the interrogation near field coupling structure 120 and the sensor near field coupling structure 122. In some embodiments, the sensor 104 is supported on a distal end 142 of an arm 144 that extends from the main body portion 140 to the asset 102. The arm 144 may be formed by one of the layers of the main body portion 140, such as layer 138, as shown in FIG. 3. In some embodiments, the arm 144 is configured to flex and bias the sensor 102 toward or against the asset 102 with a spring force represented by arrow 146. In a most exemplary example, the arm 144 is curved, providing both orientation and spring force.

The connection between the monitoring circuit 106 and the interrogation near field coupling structure 120 may take on any suitable form. In one example, the system 100 includes conductive pads 150, such as on the layer 136, an electrical connection 152 (e.g., conductive trace) between the pads 150 and the monitoring circuit 106, and a via 154 extending through the layer 136 and connecting the pads 150 to the interrogation near field coupling structure 120, as shown in FIGS. 3 and 4.

The connection between the sensor 104 and the sensor near field coupling structure 122 may take on any suitable form. In one example, the system 100 includes conductive pads 156, such as on the layer 138, an electrical connection 158 (e.g., conductive trace) between the pads 156 and the sensor 104, and a via 160 extending through the layer 138 and connecting the pads 156 to the sensor near field coupling structure 122, as shown in FIGS. 3 and 5. In some embodiments, the via 160 is coupled to the pads 156 through an electrical connection 162 within the interior of the main body portion 140, such as on the layer 130 or 138, as shown in FIG. 3.

While the passive sensors 104 may be positioned in close proximity to, or in contact with the energized asset 102, other circuitry of the system 100 must be supported by the module body 124 such that clearance, solid insulation basic impulse level and creepage requirements are met. The clearance requirement dictates the minimum distance through the air from the energized asset 102 being monitored to the conductors connected to the monitoring circuit 106. The basic impulse level requirement dictates the minimum clearance between energized parts of different electrical phases of the circuitry of each module 110, and the thickness and composition of the module body 124. The creepage requirement sets the minimum distance along the surface of the module body 124 between two conductive parts. For example, for operation under 1000 Vac with Category III overvoltage or under 600 Vac with Category IV overvoltage, typical electric power assets specify a basic impulse level (BIL) of 20 kV and a clearance of 20 mm. For operation to 5 km altitude, IEC 61010-1 specifies a clearance through air of 24 mm and a 19.2 KV BIL test of solid insulation for reinforced insulation.

The thickness and composition of the layers of the module body 124, such as layers 130, 136 and 138, may be set to meet the solid insulation BIL requirements, and the dimensions along the surface of the module body 124 or through any other path other than through the module body 124 from the conductors connected to, or in proximity with the asset 102 (e.g., energized conductor) to the conductors connected to the monitoring circuit 106 are set to meet the clearance and creepage distance requirements. As a result, the integrated sensor modules 110 of the system 100 encapsulate and integrate the safety and operational aspects of one or more near field coupled sensors 104 into a compact, easy to deploy system.

While using the thickness of the module body 124 to isolate the near field coupling structures 120 and 122 is desirable, embodiments of the present disclosure are not limited to having the sensors 104 purely on one side of the module body 124 and the monitoring circuit 106 purely on the other. In some embodiments, the sensor 104 is positioned at one end of the module body 124, such as at the distal end 142 of the arm 144 (FIGS. 3-5), and the sensor near field coupling structure 122 is positioned outside the minimum clearance and creepage distances, which are indicted by the dashed line 164, as shown in FIG. 3. The monitoring circuit coupling structure 120 may be positioned on the side 132 that opposes the side 134, and the pads 150 and the monitoring circuit 106 are positioned outside the required distance from the sensor near field coupling structure 122 and the asset 102, as shown in FIG. 3.

For temperature measurements, it is desirable to have the sensor 104 in contact with the energized asset 102 (e.g., conductor) to provide adequate accuracy of the measurement. In some applications, it may be sufficient to attach the sensor 104 directly to the arm 144 of the module body 124 (FIGS. 4 and 5) to position the sensor 104 in the desired position relative to the asset 102. However, in other applications, this may not be possible.

Some embodiments of the present disclosure are directed to a sensor support that attaches the sensor 104 to the module body 124 and electrically couples the sensor 104 to the sensor contacts or pads 156 (FIG. 3) while positioning the sensor 104 in the desired position relative to the asset 102, such as pressed against the asset 102 with a spring force that is applied by the sensor support.

Figure 6:
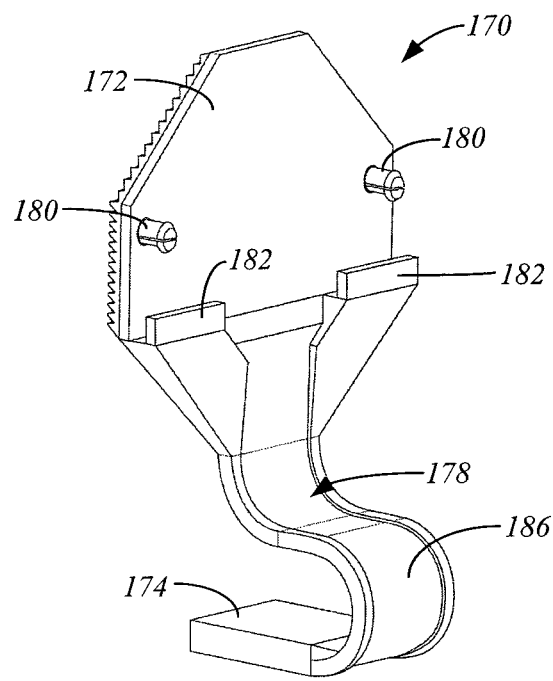
FIG. 6 is an isometric view of an exemplary sensor support, in accordance with embodiments of the present disclosure.
Figure 7:
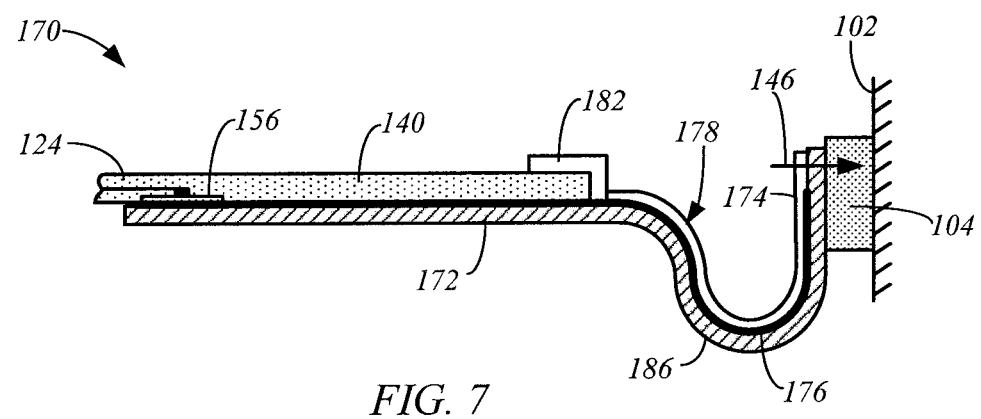
FIG. 7 is a simplified cross-sectional view of an exemplary sensor support and sensor attached to a module body, in accordance with embodiments of the present disclosure.
Figure 8:
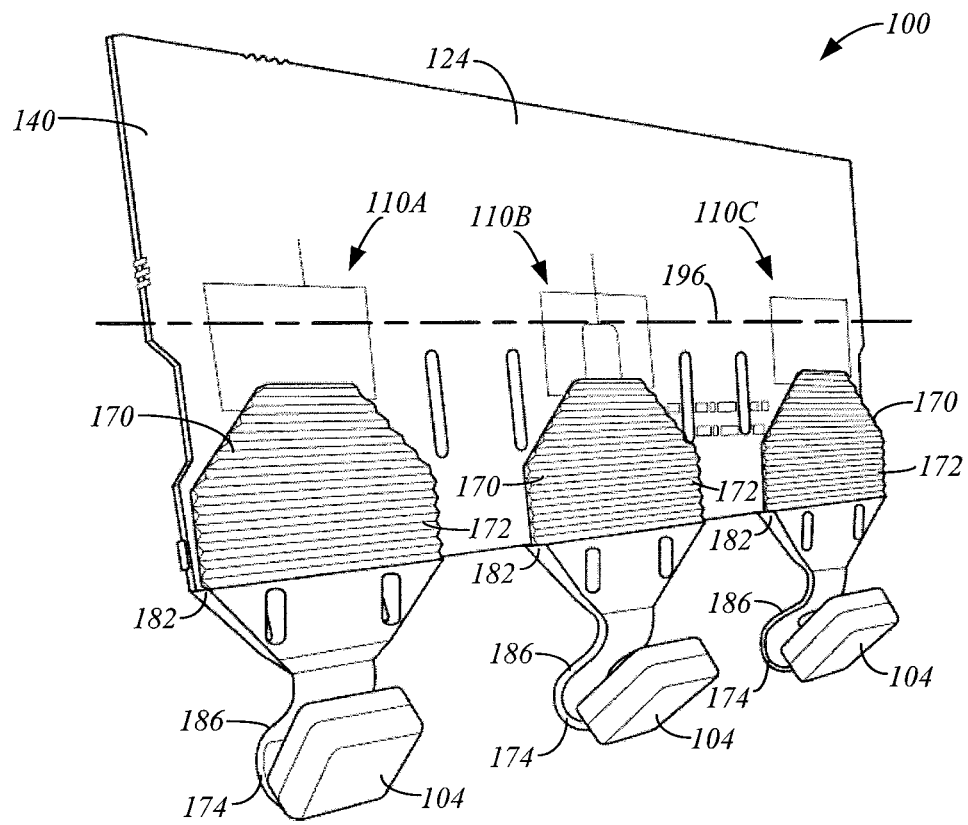
FIG. 8 is an isometric view of three of the sensor supports of FIG. 6 attached to a module body, in accordance with embodiments of the present disclosure.

FIG. 6 is an isometric view of an exemplary sensor support 170, FIG. 7 is a simplified cross-sectional view of an exemplary sensor support 170 and sensor 104 attached to a module body 124, and FIG. 8 is an isometric view of three of the sensor supports 170 of FIG. 6 attached to a module body 124, in accordance with embodiments of the present disclosure.

The sensor support 170 includes a proximal end 172 that attaches to the module body 124, such as the main body 140 or the arm 144, and a distal end 174 that supports the sensor 104, as shown in FIGS. 7 and 8. When the sensor support 170 is attached to the module body 124, one or more electrical conductors 176 provide an electrical connection between the sensor 104 and the sensor pads 156, as shown in FIG. 7. In some embodiments, the electrical conductors 176 are received within a channel 178 of the sensor support 170, which protects the electrical conductors 176 from damage. The electrical conductors 176 may be components of a flex circuit that is received within the channel 178 and/or is adhered to the sensor support 170. Such a flex circuit may offer excellent signal integrity while reducing the potential for loose wires that could snag on foreign objects and become broken.

The sensor support 170 may attach to the module body 124 using any suitable technique. In some embodiments, the sensor support 170 includes one or more pegs 180 that extend through the module body 124 and secure the sensor support thereto. Embodiments of the sensor support include a bracket 182 that is configured to receive a portion of the module body 124 and facilitate secure attachment of the support 170 to the module body 124, as shown in FIG. 7. In addition to supporting the attachment of the sensor support 170 to the module body 124, the pegs 180 and/or the bracket 182 also operate to align the electrical connection at the proximal end 172 of the sensor support 170 with the sensor pads 156, and ensures a proper electrical connection between the sensor 104 and the pads 156.

As mentioned above, it may be desirable to bias the sensor 104 in direct contact with the asset 102. In some embodiments, the sensor support 170 includes an arm or spring finger 186 that flexes and biases the sensor 104 against the asset 102, as shown in FIG. 7. The spring finger 186 offers a degree of compliance such that, when the system 100 includes multiple sensors 104 attached to the module body 124, such as shown in FIG. 8, all of the sensors 104 may be pressed into contact with their corresponding assets 102.

Exemplary materials that may be used to form the spring finger 186 include spring steel, spring brass or bronze, nitinol (NiTi) shape memory alloys, beryllium copper, and the like. These materials allow the spring finger 186 to be formed through stamped metal forming processes, and allow the spring finger 186 to maintain a suitable shape and spring constant over long operating times and at elevated temperatures. However, the use of conductive materials is limited by the high voltage requirements of the application. More exemplary materials for forming the spring finger 186 include high temperature, high strength, structural plastics, such as polyphenylsulfide, polyphenylsulphone, polyetherimide, liquid crystal plactic (LCP) and the like. Such plastics offer the added advantage of low heat capacity and low thermal conductivity in addition to having excellent high voltage insulation properties. This reduces the heat transfer away from the sensor 104 that can occur with metal. In yet another embodiment, the spring finger 186 may be formed of a flex circuit through the use of sufficiently thick flex circuit polyimide base material, for example.

Embodiments of the present disclosure also address issues of unwanted radiated signal and cross coupling to adjacent sensors 104 through the coupling structures 120 and 122 operating as poor antennas to allow for the interrogation of densely populated passive sensors 104, such as sensors 104 having an air gap of 20-100 mm, for example. As mentioned above, the interrogation near field coupling structure 120 and the sensor near field coupling structure 122 may take the form of capacitive plates/pads or coils. One issue with the use of capacitive pads as the near field coupling structures 120 and 122 is that they must be exposed outside the ground plane for coupling, which allows the capacitive pads to operate as inefficient antennas. Accordingly, for some applications, it may be preferable for the interrogation near field coupling structure 120 and sensor near field coupling structure 122 to use coils.

Figure 9:
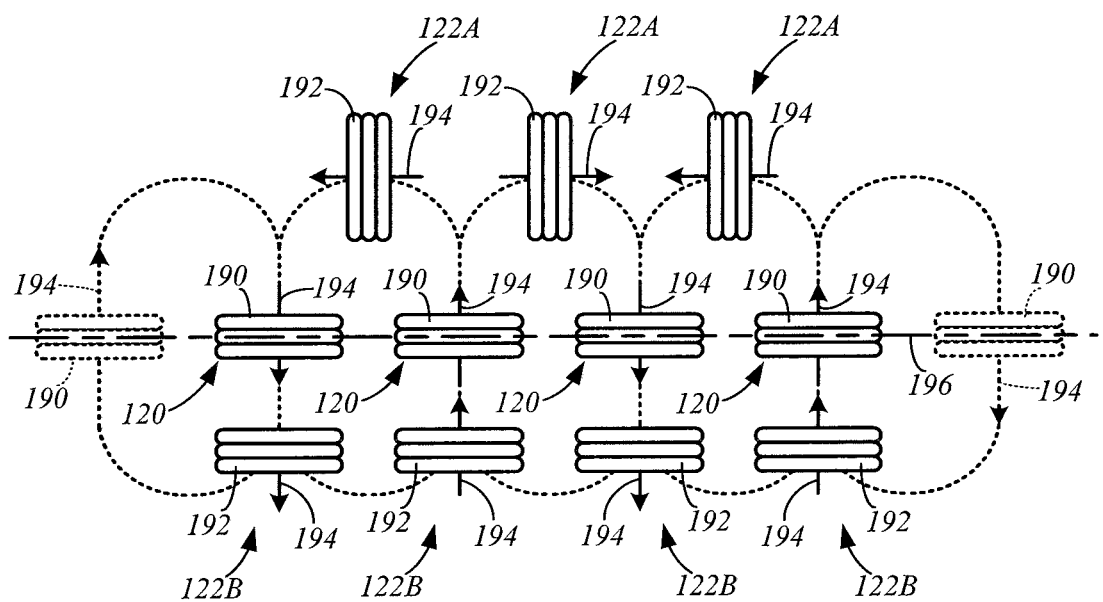
FIG. 9 is a simplified diagram of exemplary configurations for coils of an interrogation near field coupling structure and coils of a sensor near field coupling structure, in accordance with embodiments of the present disclosure.

FIG. 9 is a simplified diagram of exemplary configurations for coils 190 of the interrogation near field coupling structure 120 and coils 192 of the sensor near field coupling structure 122, in accordance with embodiments of the present disclosure. The module body 124 and circuitry connecting the coils 120B and 122B to the monitoring circuit 106 or the sensor 104 are not shown in order to simplify the illustrations.

In the arrangement illustrated in FIG. 9, exemplary upper and lower sensor near field coupling structures 122A and 122B are positioned on opposing sides of the coils 190 of the interrogation near field coupling structures 120. Each coil 192 of the upper sensor near field coupling structure 122A and each coil 192 of the lower sensor near field coupling structure 122B may represent a sensor near field coupling structure 122 of a sensor module 110. In some embodiments, one or more of the coils 190 may represent the interrogation near field coupling structure 120 of the sensor module 110 having the upper sensor near field coupling structure 122A and the interrogation near field coupling structure 120 of the sensor module 110 having the lower sensor near field coupling structure 122B. However, it is understood that embodiments of the present disclosure include sensor module arrangements in which either the upper or lower sensor near field coupling structure 122A or 122B are not present.

The coils 190 and 192 may be coplanar or helical, and formed using any suitable technique. Each of the coils 190 and 192 has a central axis, which is represented by arrows 194, that is generally concentric to the coil. Additionally, the central axes 194 of the coils 190 and 192 have an orientation or polarity, which is indicated by the direction of the corresponding arrow 194. The orientation or polarity indicates a direction of magnetic flux induced by a current traveling through the coil.

The magnetic flux from the coils 190 of the interrogation near field coupling structure 120 is configured to induce a current in the corresponding coil 192 of the sensor near field coupling structure 122A and/or 122B, and vice versa, to provide the desired magnetic coupling for the near field communication of signals 114 and 116 (FIG. 1) between the corresponding sensor 104 and monitoring circuit 106.

In some embodiments, the axes 194 of adjacent coils 190 of the interrogation near field coupling structures 120 have alternating orientations, as shown in FIG. 9. As a result, the magnetic flux from the adjacent coils 190 of the interrogation near field coupling structures 120 reinforce each other in the near field, but cancel each other in the far field. In some embodiments, the interrogation near field coupling structures 120 may include one or more end coils 190, which are shown in phantom lines, to assist in field uniformity.

In some embodiments, the axes 194 of adjacent coils 192 of the sensor near field coupling structures 122A and/or 122B have alternating orientations, as shown in FIG. 9. As a result, the magnetic flux from the adjacent coils 192 of the sensor near field coupling structures 122 reinforce each other in the near field, but cancel each other in the far field. The orientations of the coils 192 of the sensor near field coupling structures 122 may be the same as the orientations of the coils 190 of the interrogation near field coupling structure 120, such as indicated in the lower sensor near field coupling structure 122B, or different from the orientations of the coils 190 of the interrogation near field coupling structure 120, such as indicated by the coils 192 of the upper sensor near field coupling structure 122A. In some embodiments, the orientations of the coils 192 of the sensor near field coupling structure 122 may be orthogonal (e.g., perpendicular) to the orientations of the coils 190 of the interrogation near field coupling structure 120, as shown in the upper sensor near field coupling structures 122A.

The coils 190 and 192 of the interrogation near field coupling structure 120 and the sensor near field coupling structures 122A and/or 122B of different modules 110 may be displaced along an axis 196 (FIGS. 4 and 9) of the module body 124. In some embodiments, the coils 190 of the interrogation near field coupling structure 120 are positioned at locations along the axis 196 that are between the positions of the coils 192 of the sensor near field coupling structure 122, such as indicated by the coils 192 of the upper sensor near field coupling structure 122A. Alternatively, the coils 190 of the interrogation near field coupling structure 120 and the coils 192 of the sensor near field coupling structure 122 may be substantially positioned at the same locations along the axis of the module body 124, such as indicated by the coils 192 of the lower sensor near field coupling structure 122B. Each of these arrangements of the coils 190 and 192 of the near field coupling structures 120 and 122 support the reinforcement of the magnetic flux between the coils 190 and 192 in the near field.

Additional embodiments of the present disclosure relate to circuits for delivering signals 114 and 116 (FIG. 1) between the monitoring circuit 106 and the coils 190 of the interrogation near field coupling structure 120, examples of which are described below with reference to FIGS. 10-13, which are simplified circuit diagrams, in accordance with embodiments of the present disclosure. The module body 124, the sensor near field coupling structure 122, and other components are not shown to simplify the illustrations.

Figure 10:
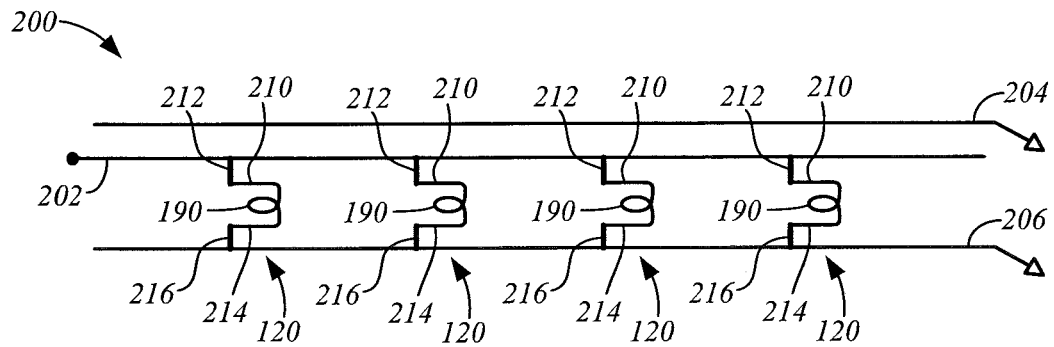
FIGS. 10-13 are simplified diagrams of circuits for delivering signals between a monitoring circuit and coils of an interrogation near field coupling structure, in accordance with embodiments of the present disclosure.

In the exemplary circuit 200 shown in FIG. 10, the signals 114 and 116 are transmitted through an unbalanced transmission line 202, which represents one of the electrical conductors 152 shown in FIG. 3. The transmission line 202 may be patterned on a layer of a printed circuit board forming a layer of the module body 124, such as layer 136 (FIG. 3), for example. The signal 114 from the monitoring circuit 106 may be generated using an unbalanced signal source with respect to outer grounded layers or sheets 204 and 206, which may be provided on layers of the module body 124. The coils 190 of the interrogation near field coupling structure 120 may be patterned on a separate circuit board layer of the module body 124, such as layer 130 (FIG. 3). A terminal 210 of each coil 190 may be connected to the transmission line through a via 212 extending through one or more layers of the module body 124, and the other terminal 214 of each coil 190 may be connected to the ground layer through a via 216 extending through one or more layers of the module body 124.

Figure 11:
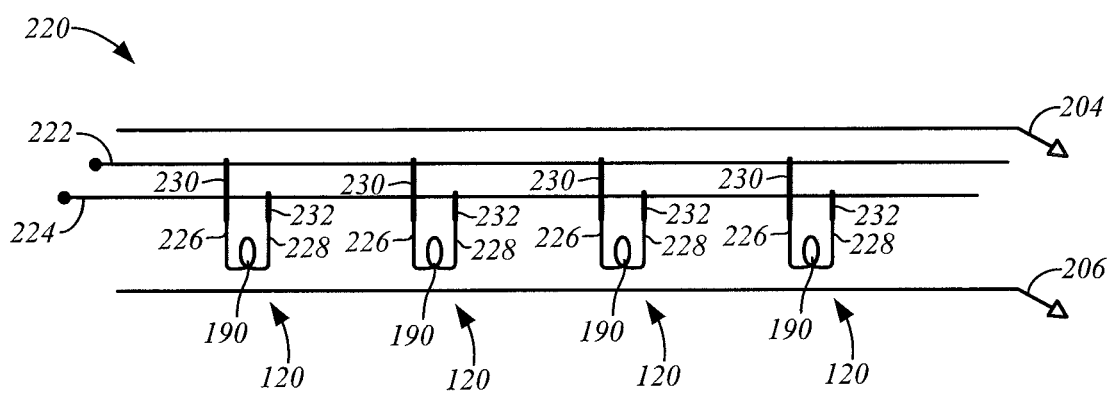

FIG. 11 shows another example of a circuit 220 that couples signals between the monitoring circuit 106 and the interrogation near field coupling structure 120, in accordance with embodiments of the present disclosure. The circuit 220 includes balanced transmission lines 222 and 224 that form the conductors 152 (FIG. 3) and communicate signals 114 and 116 between the monitoring circuit 106 and the coils 190 of the interrogation near field coupling structure 120. The transmission lines 222 and 224 may be formed on a layer of the module body 124, such as layer 136 (FIG. 3), which may be formed of a printed circuit board. Terminals 226 and 228 of each coil 190 of the interrogation near field coupling structure 120, which may be formed in a separate layer of the module body 124, such as layer 130 (FIG. 3), are connected to the transmission lines 222 and 224 through vias 230 and 232. Optionally, the circuit 220 may include outer grounded layers or sheets 204 and 206.

Figure 12:
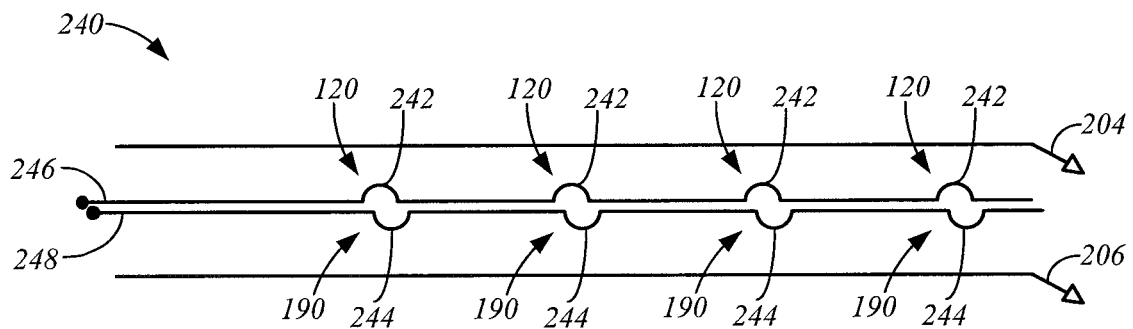

FIG. 12 illustrates another exemplary circuit 240 for communicating signals 114 and 116 between the monitoring circuit 106 and the interrogation near field coupling structure 120, in accordance with embodiments of the present disclosure. Here, the coils 190 of the interrogation near field coupling structure 120 are each formed by loops 242 and 244 within balanced transmission lines 246 and 248, respectively. The coils 190 and the balanced transmission lines 246 and 248 may be formed in the same layer of the module body 124, such as a layer of a printed circuit board, for example. The coils 190 may be formed by creating an aperture of a suitable circumference in the balanced lines 246 and 248, such that a phase shift around the half of the circumference of each coil 190 is a multiple of 180 degrees. The phase shift is determined by the path length of the electrical trace while the magnetic coupling is determined by the area enclosed. Embodiments using a meandering or fractal pattern of the electrical traces may maximize the phase shift within a desired coupling area. This pattern for the circuit 240 is well suited to flexible printed circuit board construction.

Figure 13:
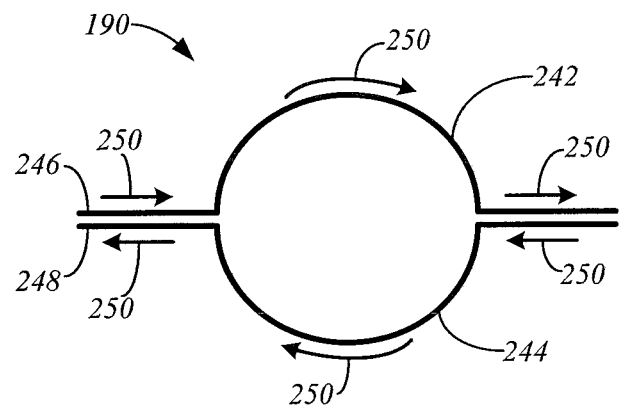

FIG. 13 illustrates signals 114 or 116, represented by arrows 250 in the loops 242 and 244 of the balanced lines 246 and 248 corresponding to the signals 114 or 116. Since a full wavelength circumference for the loops 242 and 244 is often impractical, the structure may be operated with an electrically small loop (one much smaller than a wavelength) at a reduced efficiency, or the path of the traces forming the loops 242 and 244 may meander in and out of the nominally semicircular trajectory shown to provide a wavelength of electrical length in a smaller area.

Figure 14:
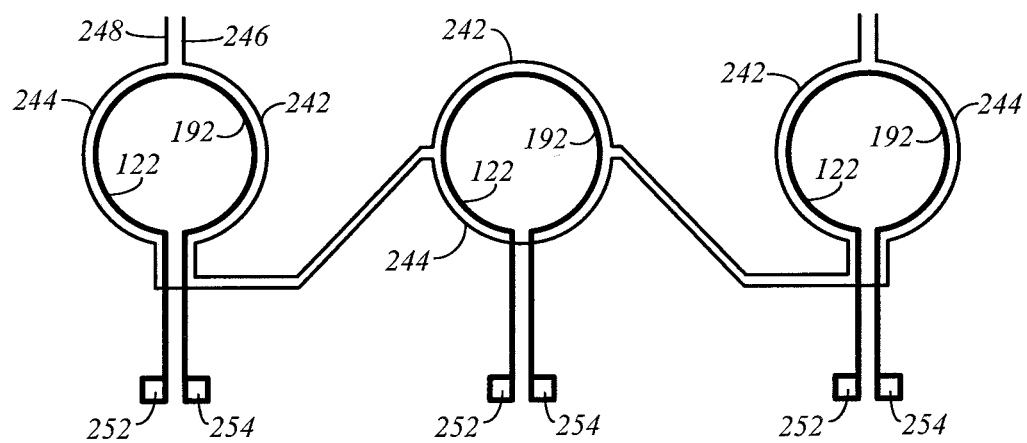
FIG. 14 illustrates an example of coils of the interrogation near field coupling structure of FIG. 13 aligned with corresponding coils of a sensor near field coupling structure, in accordance with embodiments of the present disclosure.

FIG. 14 illustrates an example of the coils 190 of the interrogation near field coupling structure 120 formed by the loops 242 and 244 of FIG. 13 aligned with corresponding coils 192 of the sensor near field coupling structure 122, in accordance with embodiments of the present disclosure. During an interrogation of the sensors 104 (FIG. 1), the monitoring circuit 106 generates current signals 114 that flow through the coils 190 of the interrogation near field coupling structure 120 formed by the loops 242 and 244, which generates magnetic flux that induces an interrogating current through the coil 192 of the corresponding sensor near field coupling structure 122. The corresponding sensors 104 receive the interrogation signal 114 through terminals that are coupled to the terminals 252 and 254 of the corresponding coil 192. The magnetically coupled interrogation signals 114 are each modified by the corresponding sensors 104 based on the sensed parameters of the assets 102. The resulting sensor current signals 116 are then delivered to the corresponding coils 192 of the sensor near field coupling structure 122, where they are magnetically coupled to the coils 190 of the interrogation near field coupling structure 120, and transmitted to the monitoring circuit 106. The monitoring circuit 106 may process the sensor signals 116, communicate the sensor signals 116 or the parameter values represented by the sensor signals 116 to another computing device, or perform another function.

Although the present invention has been described with reference to preferred embodiments, workers skilled in the art will recognize that changes may be made in form and detail without departing from the spirit and scope of embodiments of the present disclosure.

What is claimed is:

1. A sensor module for monitoring an asset in an electrical power generation or distribution system, comprising:
    a module body;
    a sensor supported by the module body and arranged to sense a parameter of the asset and configured to generate a sensor output relating to the parameter;
    a sensor near field coupling structure connected to the sensor and supported on a first side of the module body; and
    an interrogation near field coupling structure supported on a second side of the module body, wherein the sensor output is transmitted from the sensor near field coupling structure to the interrogation near field coupling structure;
    wherein the sensor module is configured to provide electrical isolation between the asset and a monitoring circuit configured to receive the sensor output through the interrogation near field coupling structure.

2. The sensor module of claim 1, wherein the transmission of the sensor output from the sensor near field coupling structure to the interrogation near field coupling structure is driven by a control signal communicated from the interrogation near field coupling structure to the sensor near field coupling structure.

3. The sensor module of claim 2, wherein the sensor comprises a thermal sensor and the asset comprises an energized conductor of the electrical power generation or distribution system.

4. The sensor module of claim 3, wherein the sensor is selected from the group consisting of a piezoelectric acoustic wave sensor and a radio frequency identification (RFID) sensor.

5. The sensor module of claim 4, wherein:
    when the sensor is a piezoelectric acoustic wave sensor, the control signal comprises a series of radio frequency (RF) pulses and the sensor output comprises a series of RF echoes; and
    when the sensor is an RFID sensor, the control signal comprises an RFID interrogation signal and the sensor output comprises a backscattered RFID response.

6. The sensor module of claim 5, wherein the sensor and interrogation near field coupling structures each comprise a capacitive coupling structure, and the sensor output is communicated through capacitive coupling between the sensor near field coupling structure and the interrogation near field coupling structure.

7. The sensor module of claim 5, wherein the sensor and interrogation near field coupling structures each comprise a coil, and the sensor output is communicated through magnetic coupling between the coils of the sensor and interrogation near field coupling structures.

8. The sensor module of claim 1, wherein the module body includes a main body portion supporting the sensor near field coupling structure and an arm having a proximal end attached to the main body portion and a distal end extending from the main body, wherein the sensor is supported at the distal end of the arm.

9. The sensor module of claim 1, further comprising a sensor support comprising:
    an arm having a proximal end attached to the module body and a distal end displaced from the module body, wherein the sensor is supported at the distal end; and
    a flex circuit supported by the arm and connecting the sensor to the sensor near field coupling structure.

10. The sensor module of claim 9, wherein the arm is configured to provide a spring-force that presses the sensor against the asset.

11. The sensor module of claim 1, wherein:
    the module body comprises a layered body; and
    the sensor and interrogation near field coupling structures are each positioned within an interior of the layered body and are separated by a layer of the layered body.

12. The sensor module of claim 11, wherein:
    the sensor is connected to a contact on a first outer surface of the layered body;
    the sensor near field coupling structure is connected to a feed line extending within the interior of the layered body;
    the contact is connected to the feed line through a first via through the layered body; and
    the interrogation near field coupling structure is connected to a conductor on an outer surface of the layered body through a via.

13. The sensor module of claim 11, wherein:
    a thickness of the layered body between the sensor near field coupling structure and the first outer surface of the layered body provides rated insulation between hazardous voltages of the asset and the sensor near field coupling structure; and
    a thickness of the layered body between the interrogation near field coupling structure and the second outer surface of the layered body provides rated insulation between hazardous voltages and the interrogation near field coupling structure.

14. The sensor module of claim 1, including a monitoring circuit supported by the module body and connected to the interrogation near field coupling structure and configured to monitor the asset using the sensor output.

15. A sensor module for monitoring one or more assets in an electrical power generation or distribution system, comprising:
    a module body;
    a plurality of sensors supported by the module body, each sensor arranged to sense a parameter of the one or more assets and configured to generate a sensor output relating to the parameter;
    a plurality of sensor near field coupling structures, each sensor near field coupling structure supported on a first side of a module body and configured to transmit the sensor output from one of the sensors; and
    a plurality of interrogation near field coupling structures supported on a second side of the module body, each interrogation near field coupling structure configured receive the sensor output from one of the plurality of sensor near field coupling structures;
    wherein the sensor module is configured to provide electrical isolation between the one or more assets and a monitoring circuit configured to receive the sensor outputs through the interrogation near field coupling structures.

16. The sensor module of claim 15, wherein the transmission of the sensor outputs from the sensor near field coupling structures to the interrogation near field coupling structures is driven by control signals communicated from the interrogation near field coupling structures to the sensor near field coupling structures.

17. The sensor module of claim 16, wherein each of the control signals at the sensor near field coupling structures have a different phase.

18. The sensor module of claim 16, wherein the sensor and interrogation near field coupling structures each comprise a capacitive coupling structure.

19. The sensor module of claim 16, wherein the sensor and interrogation near field coupling structures each comprise a coil, and the sensor output from each of the sensors is communicated to the corresponding interrogation near field coupling structure through magnetic coupling between corresponding coils of the sensor and interrogation near field coupling structures.

20. The sensor module of claim 19, wherein the coils of the sensor near field coupling structure have alternating orientations, and the coils of the interrogation near field coupling structure have alternating orientations.

21. The sensor module of claim 20, wherein:
each of the coils has a central axis;
the central axes of the coils of the sensor near field coupling structure have a first orientation;
the central axes coils of the interrogation near field coupling structure have a second orientation; and
the first orientation is different from the second orientation.

22. The sensor module of claim 21, wherein the first orientation is orthogonal to the second orientation.

23. The sensor module of claim 22, wherein:
the coils of the sensor and interrogation near field coupling structures are displaced along a body axis; and
the coils of the interrogation near field coupling structures are positioned at locations along the body axis that are between the positions of the coils of the sensor near field coupling structure along the body axis.

24. The sensor module of claim 15, including a monitoring circuit supported by the module body and connected to each of the interrogation near field coupling structures and configured to monitor the assets using the sensor outputs.

* * * * *